(12) United States Patent
Tyves et al.

(10) Patent No.: US 7,705,615 B2
(45) Date of Patent: Apr. 27, 2010

(54) EXTRUDED CAPACITIVE SENSOR ASSEMBLY AND DETECTION METHOD

(75) Inventors: Zinovy Tyves, Windsor (CA); Gary D. Bree, Clarkston, MI (US); Brent T. Repp, Royal Oak, MI (US); Seyed R. Zarabadi, Kokomo, IN (US)

(73) Assignee: STRATTEC Power Access LLC, Troy, MI (US)

( * ) Notice: Subject to any disclaimer, the term of this patent is extended or adjusted under 35 U.S.C. 154(b) by 264 days.

(21) Appl. No.: 11/999,161

(22) Filed: Dec. 4, 2007

(65) Prior Publication Data
US 2009/0072841 A1 Mar. 19, 2009

Related U.S. Application Data

(60) Provisional application No. 60/993,732, filed on Sep. 14, 2007.

(51) Int. Cl.
*G01R 27/26* (2006.01)
*G05B 5/00* (2006.01)

(52) U.S. Cl. .................. 324/687; 324/686; 324/688; 318/468

(58) Field of Classification Search .......... 324/687, 324/688
See application file for complete search history.

(56) References Cited

U.S. PATENT DOCUMENTS

| | | | |
|---|---|---|---|
| 6,038,930 A * | 3/2000 | Lehnen et al. | 73/774 |
| 6,177,329 B1 | 1/2001 | Pang | |
| 6,288,372 B1 | 9/2001 | Sandberg et al. | |
| 6,337,549 B1 * | 1/2002 | Bledin | 318/466 |
| 6,499,359 B1 * | 12/2002 | Washeleski et al. | 73/862.473 |
| 6,700,393 B2 | 3/2004 | Haag et al. | |
| 6,723,933 B2 | 4/2004 | Haag et al. | |
| 6,750,624 B2 | 6/2004 | Haag et al. | |
| 6,777,958 B2 | 8/2004 | Haag et al. | |
| 6,782,759 B2 * | 8/2004 | Shank et al. | 73/780 |
| 7,132,642 B2 * | 11/2006 | Shank et al. | 250/221 |
| 7,151,350 B2 | 12/2006 | Haag et al. | |
| 7,202,674 B2 * | 4/2007 | Nakano et al. | 324/661 |
| 7,319,301 B2 * | 1/2008 | Pribisic | 318/468 |

(Continued)

OTHER PUBLICATIONS

European Search Report dated Nov. 26, 2008.
U.S. Appl. No. 11/784,036, Zarabadi et al.

*Primary Examiner*—Timothy J Dole
*Assistant Examiner*—John Zhu
(74) *Attorney, Agent, or Firm*—Michael Best & Friedrich LLP

(57) ABSTRACT

An extruded capacitive sensor assembly includes multiple sense conductors of unequal length disposed in an upper section of a non-conductive jacket, and a ground conductor disposed in a lower section of the jacket adjacent a panel or carrier to which the strip is affixed. A sensor strip with three sense conductors is formed by extruding a non-conductive jacket having first and second sense conductors in the upper section of the jacket, and severing the first sense conductor to create three unequal length sense conductor segments. Electrical termination to the sense and ground conductors can be made at the point where the first sense conductor is severed, or at the end of the sensor strip. In cases where only two sense conductor segments are needed, the third sense conductor segment is removed or simply un-used.

14 Claims, 4 Drawing Sheets

U.S. PATENT DOCUMENTS

| | | | |
|---|---|---|---|
| 7,616,011 B2 * | 11/2009 | Zarabadi et al. | 324/678 |
| 2003/0223701 A1 | 12/2003 | Furumai et al. | |
| 2004/0251917 A1 | 12/2004 | Blanchard | |
| 2005/0268734 A1 | 12/2005 | Watkins, Jr. et al. | |

* cited by examiner

EXTRUDED CAPACITIVE SENSOR ASSEMBLY AND DETECTION METHOD

RELATED APPLICATIONS

This application claims the benefit of provisional U.S. patent application Ser. No. 60/993,732, filed Sep. 14, 2007.

TECHNICAL FIELD

The present invention relates to a capacitive sensor strip for non-contact obstacle detection, and more particularly to an extruded sensor strip having multiple conductor segments of unequal length and a corresponding detection method.

BACKGROUND OF THE INVENTION

Extruded capacitive sensor strips for non-contact obstacle detection have been disclosed, for example, in the U.S. Pat. Nos. 6,700,393, 6,723,933, 6,750,624 and 6,777,958 to Haag et al., assigned to Delphi Technologies, Inc. and incorporated by reference herein, in the context of an enclosure surface and a movable panel. Additionally, the pending patent application U.S. Ser. No. 11/784,036, filed Apr. 5, 2007, also assigned to Delphi Technologies, Inc. and incorporated by reference herein, discloses a capacitive strip sensor having a set of three sensor segments and a detection circuit that samples and combines the fringing capacitance of each sensor segment to form an output that is insensitive to common-mode effects such as moisture, temperature and sensor aging.

SUMMARY OF THE INVENTION

The present invention is directed to an extruded capacitive sensor assembly including a sensor strip having a ground conductor and two or more sense conductors, and a corresponding non-contact detection method. In a preferred embodiment, the sensor strip includes three sense conductors of unequal length disposed in an upper section of a non-conductive jacket, and a ground conductor disposed in a lower section of the jacket adjacent a panel or carrier to which the strip is affixed. The sensor strip is formed by extruding a non-conductive jacket having first and second sense conductors in the upper section of the jacket, and severing the first sense conductor to create three unequal length sense conductor segments. Electrical termination to the sense and ground conductors can be made at the point where the first sense conductor is severed, or at the end of the sensor strip. A detection circuit responsive to the fringing capacitances of the sense conductor segments provides a detection output that is sensitive to obstacles in proximity to the sensor strip but insensitive to common-mode effects on capacitance. In cases where only two sense conductor segments are needed, the third sense conductor segment is removed or simply un-used. The sense conductors may be formed with braided wire or a single wire encased in conductive polymer material.

DESCRIPTION OF THE PREFERRED EMBODIMENT

Figure 1:
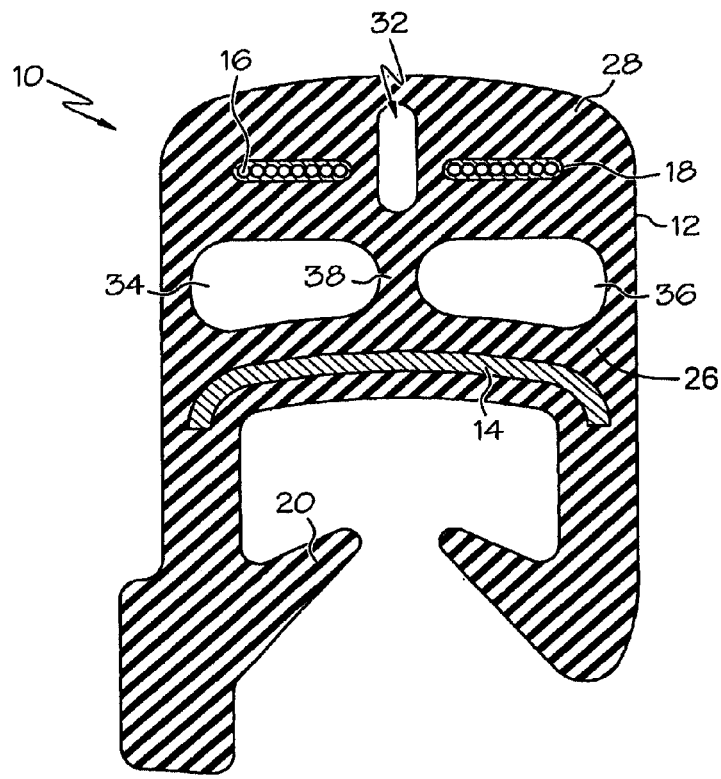
FIG. 1 is a cross-sectional diagram of an extruded capacitive sensor strip according to a first embodiment of this invention.
Figure 2:
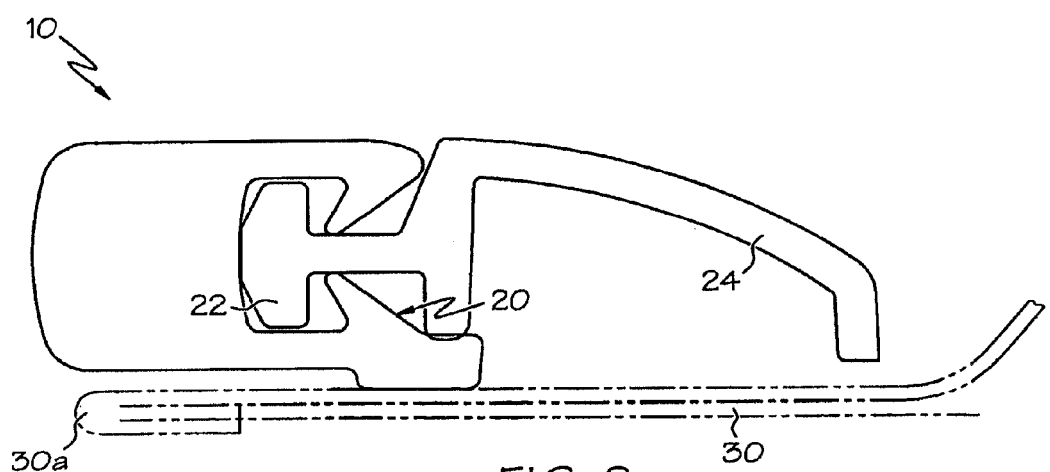
FIG. 2 is a diagram of the sensor strip of FIG. 1 mounted on a carrier that is affixed to a movable panel.

Referring to the drawings, and particularly to FIGS. 1-4, the reference numeral 10 generally designates a capacitive sensor strip constructed according to a first embodiment of this invention. The sensor strip 10 includes an extruded case or jacket 12 of resilient non-conductive material and a set of co-extruded conductors, including a ground conductor 14 and first and second sense conductors 16 and 18. The jacket 12 includes a mounting portion 20 for snap fit attachment of the sensor strip 10 to the head 22 of a plastic carrier 24 (see FIG. 2), a lower section 26 adjacent the mounting portion 20 in which the ground conductor 14 is disposed, and an upper section 28 opposite the mounting portion 20 in which the sense conductors 16 and 18 are disposed. If desired, the conductors 14-18 may be disposed in conformal air pockets within the jacket 12 for ease of stripping and termination. The carrier 24 is affixed to a movable panel 30 as indicated in FIG. 2 so that the upper section 28 of sensor strip 10 is adjacent a leading edge 30a of the panel 30 to sense obstacles in the travel path of the panel 30 when driven leftward as viewed in FIG. 2. As explained in the aforementioned U.S. Ser. No. 11/784,036, obstacle detection is based on changes in fringing capacitance between the sense conductors 16, 18 and the ground conductor 14. The sensor strip 10 is designed to be sufficiently sensitive to detect an obstacle such as a human finger in time to avoid contact between the panel 30 and the obstacle, while being substantially insensitive to environmental effects such as moisture.

Figure 3:
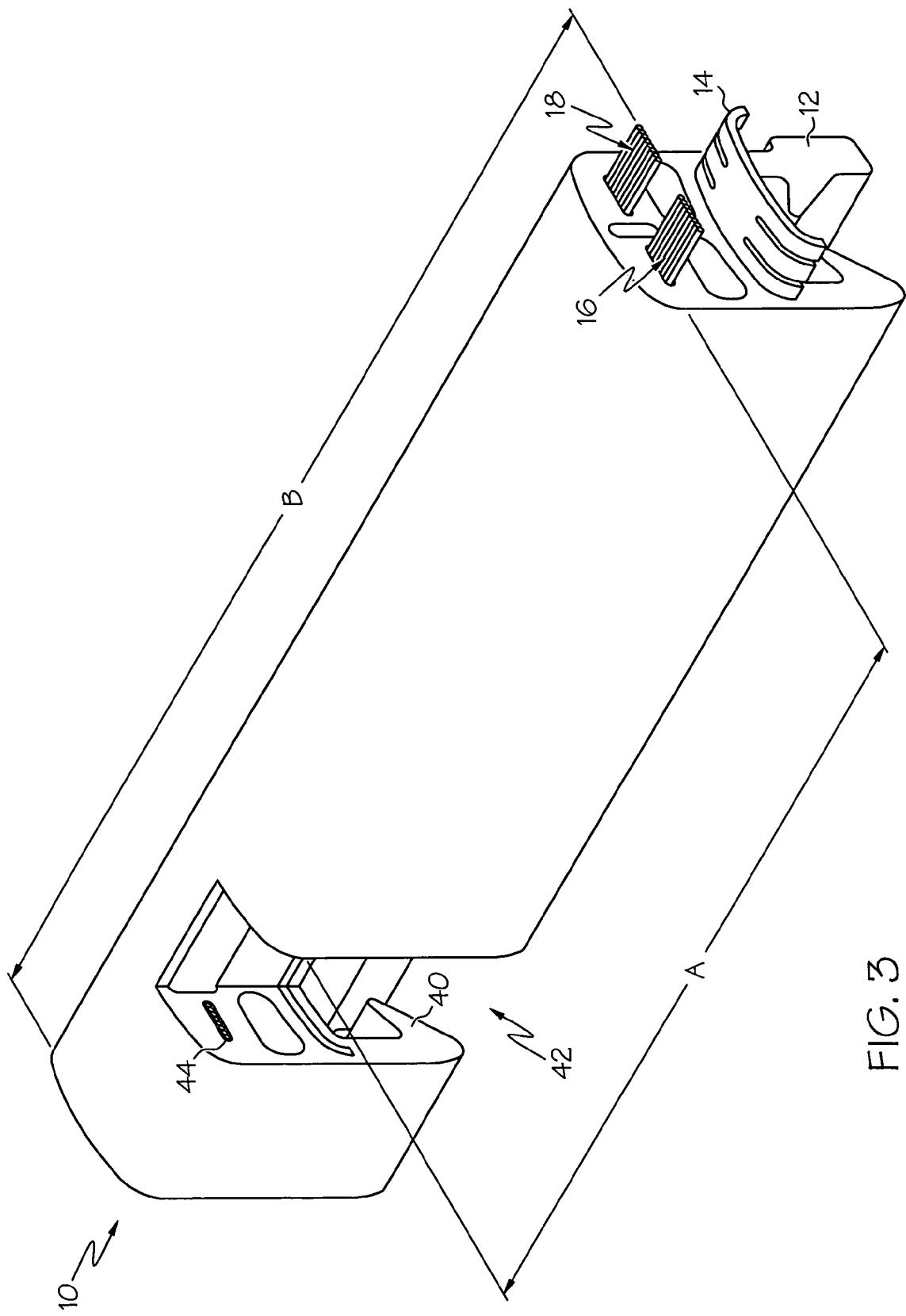
FIG. 3 is an isometric diagram of the extruded capacitive sensor strip of FIG. 1 configured to provide two unequal length sense conductors.
Figure 4:
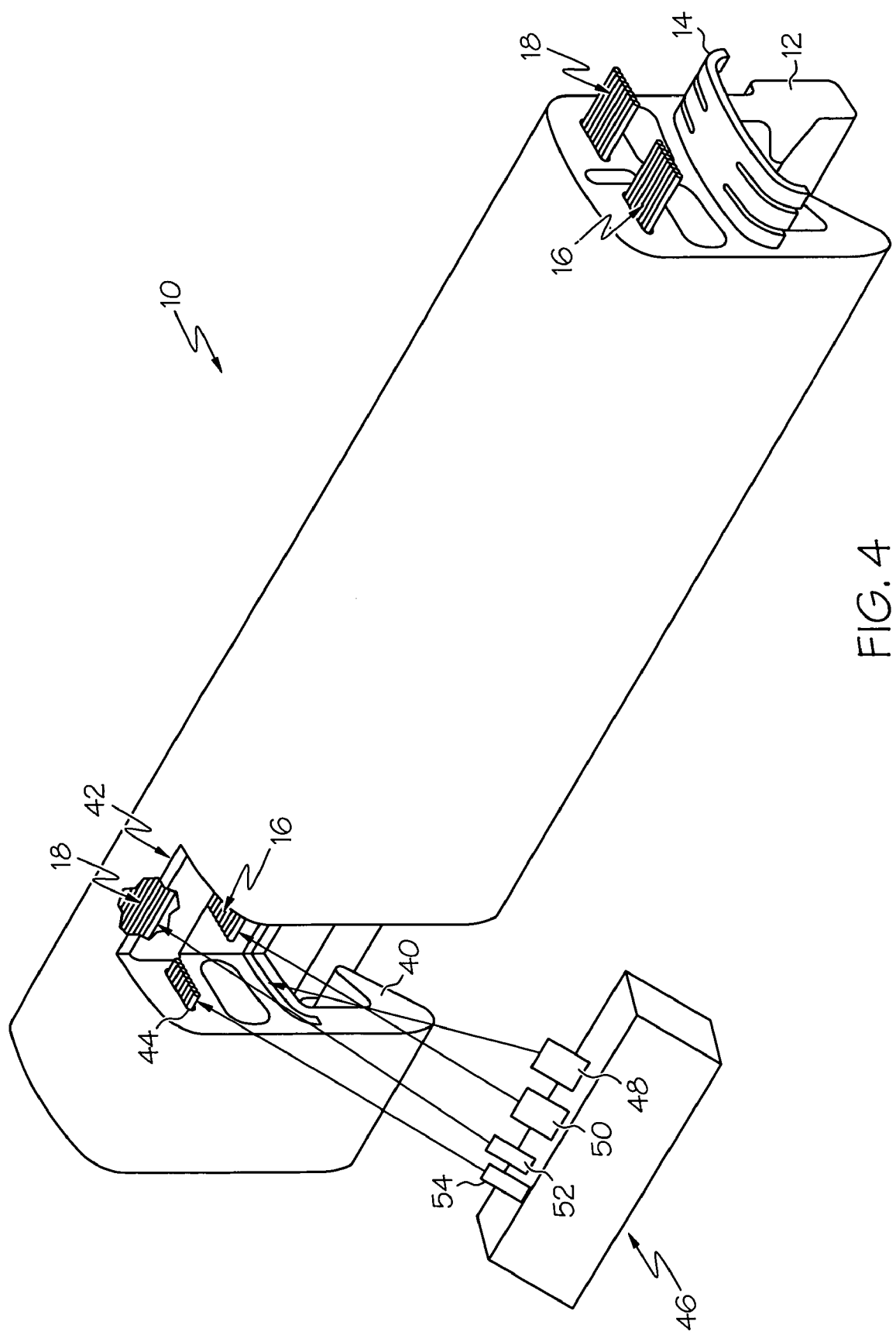
FIG. 4 is an isometric diagram of the extruded capacitive sensor strip of FIG. 1, configured to provide three unequal length sense conductors.

Referring again to FIG. 1, the sense conductors 16 and 18 are formed of flat-braided metal wire, and are laterally separated within the jacket 12. Additional dielectric isolation between sense conductors 16 and 18 is provided by an air pocket 32 disposed between sense conductors 16 and 18 along their entire length. Dielectric isolation between sense conductor 16 and ground conductor 14 is enhanced by an air pocket 34 disposed between sense conductor 16 and ground conductor 14; and dielectric isolation between sense conductor 18 and ground conductor 14 is enhanced by an air pocket 36 disposed between sense conductor 18 and ground conductor 14. The vertical bridge of dielectric jacket material 38 between air pockets 34 and 36 provides a stable geometry for the strip 10 along its entire length for improved obstacle detection consistency. As best seen in FIGS. 3-4, the ground conductor 14 may be a stamped metal strip with bi-lateral cutouts in the manner of a fish bone or rib-cage to provide both compliance and bi-lateral symmetry.

As mentioned above, an important aspect of the sensor strip 10 according to this invention is that the sense conductors 16, 18 have unequal lengths. This ensures that the sense conductors will be differentially sensitive to obstacles in proximity to the strip 10, while being similarly sensitive to common mode environmental effects such as moisture. Combining the sensor outputs as described in the aforementioned U.S. Ser. No. 11/784,036 makes detection insensitive to the common mode environmental effects, and the unequal lengths of the sense conductors ensure that obstacle detection sensitivity is retained.

Extruding the sensor strip 10 as described above results in two sense conductors 16 and 18 of equal length. As depicted in FIGS. 3-4, the sense conductor lengths are made unequal by forming a notch or cutout 40 at a point 42 along the length of the strip 10 and severing one of the sense conductors (16 or 18) to shorten the severed sense conductor relative to the un-severed sense conductor.

FIG. 3 depicts a two sense conductor embodiment in which the jacket material 12 is removed or stripped away at one end of the strip 10 to expose ground conductor 14 and sense conductors 16 and 18 for attachment to a detection circuit (not shown). Due to the cutout 40, the sense conductor 16 has a length dimension A, while the un-severed sense conductor 18 has a longer length dimension B. The unused end segment 44 of sense conductor 16 can remain in the strip 10, or be removed. The cutout 40 is filled or overmolded with a non-conductive sealant to form a moisture barrier and to give the strip 10 a uniform appearance along its length.

FIG. 4 depicts a preferred embodiment having a cutout 40 like the embodiment of FIG. 3, but where the end segment 44 of sense conductor 16 is utilized as a third sense conductor. In general, the three sense conductor embodiment is preferable to the two sense conductor embodiment of FIG. 3 because the obstacle detection zone is enhanced. In the three sense conductor embodiment, the detection circuit 46 must be electrically coupled to all three sense conductors 16, 18 and 44 as well as the ground conductor 14. As shown in FIG. 4, this can be achieved by coupling the detection circuit terminals 48, 50, 52 and 54 to the conductors 14, 16, 18 and 44 at the cutout 40. Preferably, the detection circuit module 46 is inserted into the cutout 42 and sealed in place. In this case, both ends of the sensor strip 10 may be capped off to seal out moisture.

Figure 5:
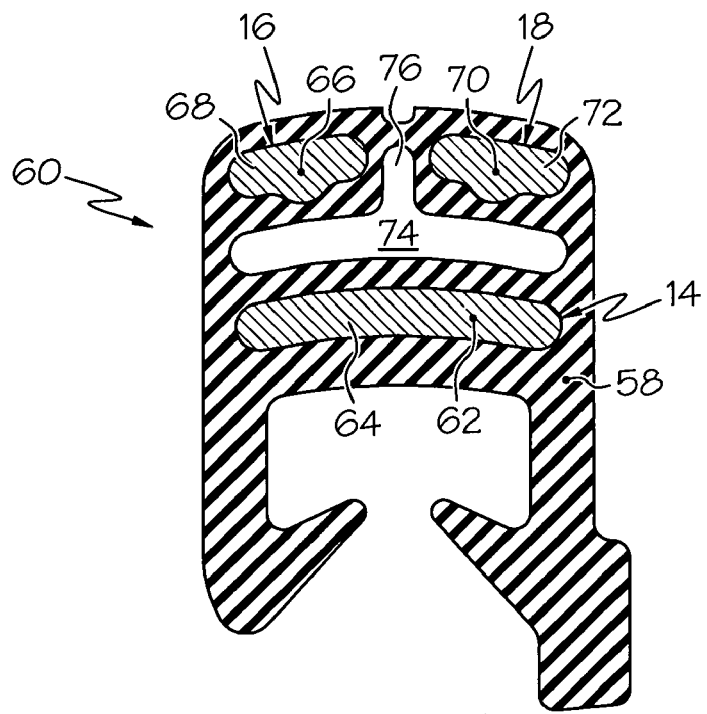
FIG. 5 is a cross-sectional diagram of an extruded capacitive sensor strip according to a second embodiment of this invention.
Figure 6:
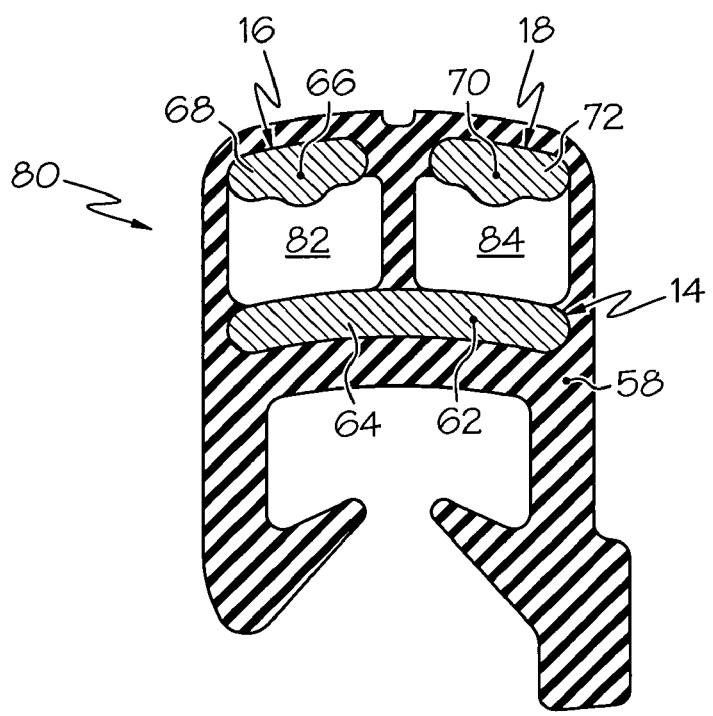
FIG. 6 is a cross-sectional diagram of an extruded capacitive sensor strip according to a third embodiment of this invention.

FIGS. 5-6 depict two sensor strip embodiments in which the ground and sense conductors 14, 16, 18 each comprise a single wire encased in a shell of conductive polymer material. A cutout is still formed at a point along the length of the strip to sever the sense conductor 16 as described above in respect to FIGS. 3-4, but the conductive polymer shells simplify electrical terminations between the ground and sense conductors and the detection circuit 46. Additionally, the sensor strips of FIGS. 5-6 include a co-extruded wire 58 to enable electrical termination at the end of the sensor strip in a three-sense conductor version.

The sensor strip of FIG. 5 is generally designated by the reference numeral 60. The ground conductor 14 comprises a single wire 62 encased in a shell 64 of conductive polymer material; the sense conductor 16 comprises a single wire 66 encased in a shell 68 of conductive polymer material; and the sense conductor 18 comprises a single wire 70 encased in a shell 72 of conductive polymer material. A single air pocket 74 provides enhanced dielectric isolation between the sense conductors 16 and 18, as well as between the ground conductor 14 and the sense conductors 16-18. The air pocket 74 has a lateral extent similar to that of ground conductor 14 and a vertical ridge 76 extending between the sense conductors 16 and 18. Once the cutout 40 is formed and the sensor conductor 16 severed as described above in reference to FIGS. 3-4, the cutout 40 is filled or overmolded with a nonconductive sealant to form a moisture barrier and to give the strip 60 a uniform appearance along its length. The nonconductive jacket material is removed or stripped away at one end of the sensor strip 60 to expose the ends of ground conductor 14, sense conductors 16 and 18, and the wire 58 for attachment to the detection circuit terminals 48-54. The nonconductive jacket material at the opposite end of sensor strip 60 is also removed or stripped away to expose at least the ends of the end-segment sense conductor 44 and the wire 58; and the wire 58 is electrically coupled to the exposed portion of the end-segment sense conductor 44 so that the wire 58 electrically ties the end-segment sense conductor 44 to a respective terminal of detector circuit 46. Finally, the ends of the sensor strip 60 are sealed to provide a moisture barrier.

The sensor strip of FIG. 6 is generally designated by the reference numeral 80. It is like the sensor strip 60 of FIG. 5 except that in this case, there are two air pockets 82 and 84 in place of the single air pocket 74, and the air pockets 82, 84 fully extend between the conductive polymer shell 64 of ground conductor 14 and the conductive polymer shells 68 and 72 of sense conductors 16 and 18. A third air pocket could be added between the sense conductors 16 and 18 if desired. Since the air pockets 82 and 84 fully extend between the conductive polymer shell 64 of ground conductor 14 and the conductive polymer shells 68 and 72 of sense conductors 16 and 18 (and end-segment sense conductor 44), the conductive polymer shells 68 and/or 72 will physically contact the conductive polymer shell 64 if the sensor strip 80 collapses due to engaging an obstacle. Detection circuit 46 is configured to detect such a contact based on the electrical resistance between the ground and sense conductors, and this provides contact-based obstacle detection for redundancy.

In summary, the present invention provides an easily manufactured and reliable sensor strip for non-contact obstacle detection. While the sensor strip and its method of manufacture have been described with respect to the illustrated embodiments, it is recognized that numerous modifications and variations in addition to those mentioned herein will occur to those skilled in the art. For example, the sensor strip may include more than three sense conductors, and so on. Accordingly, it is intended that the invention not be limited to the disclosed embodiments, but that it have the full scope permitted by the language of the following claims.

The invention claimed is:

1. An extruded capacitive sensor assembly, comprising:
  an extruded jacket of non-conductive material;
  a set of conductors co-extruded with the jacket, including a ground conductor disposed in a lower section of the jacket and first and second sense conductors disposed in an upper section of the jacket, where the first and second sense conductors have lengths that are unequal and a cut is made intermediate the length of the first sense conductor, such that the length of the first sense conductor is less than the length of the second sense conductor; and
  a detector circuit coupled to said ground conductor and said first and second sense conductors to detect obstacles in proximity to said sensor assembly based on fringing capacitance between said ground conductor and said first and second sense conductors.

2. The extruded capacitive sensor assembly of claim 1, further comprising:
  an air pocket in the upper section of said jacket between said first and second sense conductors.

3. The extruded capacitive sensor assembly of claim 1, further comprising:
  a first air pocket disposed between said first sense conductor and said ground conductor;
  a second air pocket disposed between said second sense conductor and said ground conductor; and
  a bridge of jacket material between said first and second air pockets.

4. The extruded capacitive sensor assembly of claim 1, where said first and second sense conductors each comprise a wire encased in a shell of conductive polymer material.

5. An extruded capacitive sensor assembly, comprising:
an extruded jacket of non-conductive material;
a set of conductors co-extruded with the jacket, including a ground conductor disposed in a lower section of the jacket and first and second sense conductors disposed in an upper section of the jacket;
a cutout at a point intermediate a length of said jacket that severs said first sense conductor to shorten said first sense conductor relative to said second sense conductor; and
a detector circuit coupled to said ground conductor and said first and second sense conductors to detect obstacles in proximity to said sensor assembly based on fringing capacitance between said ground conductor and said first and second sense conductors.

6. The extruded capacitive sensor assembly of claim 5, where:
said detector circuit is coupled to said ground conductor and said first and second sense conductors at said cutout.

7. The extruded capacitive sensor assembly of claim 5, where:
a severed portion of said first sense conductor defines a third sense conductor; and
said detector circuit is coupled to said ground conductor and said first, second and third sense conductors to detect the obstacles in proximity to said sensor assembly based on fringing capacitance between said ground conductor and said first, second and third sense conductors.

8. The extruded capacitive sensor assembly of claim 7, where said detector circuit is coupled to said ground conductor and said first, second and third sense conductors at said cutout.

9. The extruded capacitive sensor assembly of claim 7, where:
said detection circuit is coupled to said ground conductor and said first and second sense conductors at an end of said jacket; and
said set of conductors co-extruded with the jacket includes a fourth conductor coupling said third sense conductor to said detector circuit.

10. A method of detecting obstacles in proximity to a carrier, comprising the steps of:
co-extruding an elongate strip of non-conductive material, a ground conductor, and first and second sense conductors spaced from each other and from said ground conductor;
forming a cutout on the strip that severs said first sense conductor at a point intermediate its length to shorten said first sense conductor relative to said second sense conductor;
affixing said strip to said carrier; and
detecting obstacles in proximity to said carrier based on fringing capacitance between said ground conductor and said first and second sense conductors.

11. The method of claim 10, including the steps of:
providing a detection circuit for detecting the obstacles in proximity to said carrier based on fringing capacitance between said ground conductor and said first and second sense conductors; and
coupling said detector circuit to said ground conductor and said first and second sense conductors at said cutout.

12. The method of claim 10, where:
a severed portion of said first sense conductor becomes a third sense conductor; and
said detector circuit is coupled to said ground conductor and said first, second and third sense conductors to detect the obstacles in proximity to said carrier based on fringing capacitance between said ground conductor and said first, second and third sense conductors.

13. The method of claim 12, including the step of:
coupling said detector circuit to said ground conductor and said first, second and third sense conductors at said cutout.

14. The method of claim 12, including the steps of:
co-extruding an additional conductor in the elongate strip of non-conductive material;
coupling said additional conductor to said third sense conductor at a first end of said elongate strip; and
coupling said detector circuit to said ground conductor, said first and second sense conductors, and said additional conductor at second end of said elongate strip opposite said first end.

* * * * *